United States Patent
Yu et al.

(10) Patent No.: US 8,665,988 B2
(45) Date of Patent: Mar. 4, 2014

(54) DEVICE AND METHOD FOR REALIZING PREFIX CODE CONSTRUCTION

(75) Inventors: Lei Yu, Guangdong (CN); Zheng Wei, Guangdong (CN); Laiguo Zhai, Guangdong (CN); Zhixin Tong, Guangdong (CN); Hongfeng Sun, Guangdong (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 185 days.

(21) Appl. No.: 13/202,189

(22) PCT Filed: Dec. 21, 2009

(86) PCT No.: PCT/CN2009/075805
§ 371 (c)(1),
(2), (4) Date: Aug. 18, 2011

(87) PCT Pub. No.: WO2010/094204
PCT Pub. Date: Aug. 26, 2010

(65) Prior Publication Data
US 2011/0299624 A1 Dec. 8, 2011

(30) Foreign Application Priority Data
Feb. 19, 2009 (CN) .......................... 2009 1 0105542

(51) Int. Cl.
*H04L 27/00* (2006.01)
(52) U.S. Cl.
USPC ........... 375/295; 375/140; 375/114; 375/110; 341/187; 370/208; 370/342; 370/140

(58) Field of Classification Search
USPC .................. 375/295, 140, 114, 110; 341/187; 370/208, 342, 140
See application file for complete search history.

(56) References Cited

U.S. PATENT DOCUMENTS

| | | | | |
|---|---|---|---|---|
| 4,670,890 A | * | 6/1987 | Titchener | 375/359 |
| 5,481,364 A | * | 1/1996 | Ito | 382/244 |
| 6,496,474 B1 | * | 12/2002 | Nagatani et al. | 370/208 |
| 6,504,496 B1 | * | 1/2003 | Mesarovic et al. | 341/106 |
| 6,580,828 B1 | * | 6/2003 | Li | 382/233 |
| 2003/0043917 A1 | * | 3/2003 | Bublil et al. | 375/240.25 |
| 2004/0233076 A1 | * | 11/2004 | Zhou | 341/67 |
| 2007/0146194 A1 | * | 6/2007 | Honda et al. | 341/187 |

* cited by examiner

*Primary Examiner* — Sam K Ahn
*Assistant Examiner* — Fabricio R Murillo Garcia
(74) *Attorney, Agent, or Firm* — PatentVentures; Bennett Smith; Korbin Van Dyke (57) ABSTRACT

The present invention provides a device and method for realizing prefix code construction. The device includes a sort indexer, a generator and a sequence regulator. The sort indexer is used to sort a group of received code lengths to obtain a group of sorted code lengths, and record the position correspondence relationship. The generator receives the sorted code lengths and orderly generates the prefix codes. Except that the first prefix code is preconfigured, the generator generates a current prefix code by adding one to the adjacently previous prefix code and then shifting left by a certain number of bits. The sequence regulator is used to receive the prefix codes corresponding to the sorted code lengths, and regulates the sequence of the prefix codes corresponding to the sorted code lengths according to the position correspondence relationship recorded by the sort indexer to obtain the prefix codes corresponding to the code lengths.

11 Claims, 7 Drawing Sheets

| S_RLPIDLength[N] | S_RLPID[N] | S_RLPID[N] |
|---|---|---|
| S_RLPIDLength[0] = 2 | RLPID[0] = 0 | 0 0 |
| S_RLPIDLength[1] = 2 | RLPID[1] = 1 | 0 1 |
| S_RLPIDLength[2] = 3 | RLPID[2] = 4 | 1 0 0 |
| S_RLPIDLength[3] = 3 | RLPID[3] = 5 | 1 0 1 |
| S_RLPIDLength[4] = 3 | RLPID[4] = 6 | 1 1 0 |
| S_RLPIDLength[5] = 6 | RLPID[5] = 56 | 1 1 1 0 0 0 |
| S_RLPIDLength[6] = 6 | RLPID[6] = 57 | 1 1 1 0 0 1 |

| S_RLPIDLength[N] | S_RLPID[N] | S_RLPID[N] |
|---|---|---|
| RLPIDLength[0] = 2 | RLPID[0] = 0 | 0 \| 0 |
| RLPIDLength[1] = 2 | RLPID[1] = 1 | 0 \| 1 |
| RLPIDLength[2] = 2 | RLPID[2] = 3 | 1 \| 0 |
| RLPIDLength[3] = 3 | RLPID[3] = 6 | 1 \| 1 \| 0 |
| RLPIDLength[4] = 3 | RLPID[4] = 7 | 1 \| 1 \| 1 |
| RLPIDLength[5] = 3 | RLPID[5] | |
| RLPIDLength[6] = 6 | RLPID[6] | |

Fig.8

DEVICE AND METHOD FOR REALIZING PREFIX CODE CONSTRUCTION

FIELD OF THE INVENTION

The present invention relates to the field of mobile communication systems, especially a device and a method for realizing prefix code construction in a mobile communication system.

BACKGROUND OF THE INVENTION

With the development and popularization of the mobile communication, people's demands for a real-time multimedia application service become more and more urgent. For this purpose, a CDMA0-EVDO mobile communication system brings in a multithread application, so as to support the real-time multimedia application service based on Quality of Service (QoS). In this mobile communication system, each user can create multiple Radio Link Protocol (RLP) streams on the application layer. In order to identify which stream an RLP message belongs to, each RLP stream needs to be configured with RLPID and RLPIDLength attributes. In the above, the RLPID is represented as a binary code field, and the RLPIDLength indicates the number of bits of the binary code corresponding to the RLPID.

Figure 1:
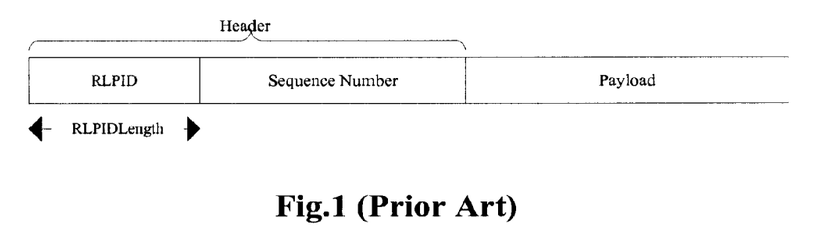
FIG. 1 is a schematic diagram of an RLP message.

Refer to FIG. 1 for the schematic diagram of an RLP message. The high RLPIDLength bits of an RLP message header (Header) is the RLPID field, and the RLP message header also includes: a Sequence Number and effective payload (Payload). When an Access Terminal or an Access Network receives the RLP message, if the RLPID field in the RLP message header matches with the RLPID attribute of a certain stream, then the message belongs to this stream.

To make such identification manner unique, the RLPID of all streams shall satisfy the following condition: any RLPID is not the prefix of another RLPID.

In addition, in the actual application, considering that the size of RLPIDLength will affect indirectly the rate for transmitting or receiving a message on a stream, this parameter needs to be configured according to the requirements of the operator. Therefore, it is expected in the industry that a group of RLPIDs can be constructed according to a group of given RLPIDLengths, and the group of RLPIDs construct a prefix code, so as to meet the requirements of the rate for transmitting or receiving messages in the actual application.

The famous Huffman Coding is a method for constructing prefix codes, which constructs a group of prefix codes with the shortest average code length by constructing an optimal binary tree. However, as for the above mentioned prefix code application in the mobile communication, this algorithm has the following problem: it can construct a group of prefix codes with the shortest average code length according to a given probability distribution, but it cannot construct, according to a group of given code lengths, the corresponding prefix codes. That is, the RLPIDs cannot be constructed according to the given RLPIDLengths through that method.

SUMMARY OF THE INVENTION

To solve the problem that the corresponding prefix codes cannot be constructed according to a group of given code lengths, it is necessary to provide a device for realizing prefix code construction to construct the corresponding prefix codes according to a group of given code lengths.

In addition, it is also necessary to provide a method for realizing the above mentioned prefix code construction.

The device for realizing prefix code construction according to the present invention includes a sort indexer, a generator, and a sequence regulator, wherein:

the sort indexer is configured to receive a group of code lengths, sort the code lengths to obtain a group of sorted code lengths, and record a position correspondence relationship between the sorted code lengths and the code lengths;

the generator receives the sorted code lengths, orderly generates prefix codes corresponding to the sorted code lengths, wherein except that a first prefix code is preconfigured, the generator generates a current prefix code by adding 1 to an adjacently previous prefix code and then shifting left by a certain number of bits, the certain number of the bits is the difference between the sorted code length corresponding to the current prefix code and the sorted code length corresponding to the adjacently previous prefix code; and, when the current prefix code is generated, the generator simultaneously judges whether the adjacently previous prefix code is identical to the current prefix code from high bit, if yes, outputs error information, otherwise, generates the prefix codes corresponding to the sorted code lengths; and the sequence regulator is configured to receive the prefix codes corresponding to the sorted code lengths, and regulate, according to the position correspondence relationship recorded by the sort indexer, a sequence of the prefix codes corresponding to the sorted code lengths to obtain the prefix codes corresponding to the code lengths.

In the above mentioned device, the code lengths are sorted in an increasing sequence.

In the above mentioned device, the first prefix code is preconfigured as 0.

The above mentioned device further comprises: an input interface, configured to receive the code lengths inputted by a user, and transmit the code lengths to the sort indexer.

The above mentioned device further comprises: an output interface, configured to receive and output the error information transmitted by the generator or the prefix codes corresponding to the code lengths transmitted by the sequence regulator.

The method for realizing prefix code construction according to the present invention includes the following steps:

a sort indexer receiving a group of code lengths, sorting the code lengths to obtain a group of sorted code lengths, and recording a position correspondence relationship between the sorted code lengths and the code lengths;

a generator receiving the sorted code lengths, orderly generating corresponding prefix codes, wherein except that a first prefix code is preconfigured, a current prefix code is obtained by adding 1 to an adjacently previous prefix code and shifting left by a certain number of bits, the certain number of the bits is the difference between the sorted code length corresponding to the current prefix and the sorted code length corresponding to the adjacently previous prefix code; the generator judges whether the adjacently previous prefix code is identical to the current prefix code from high bit, if yes, the construction fails, and error information is outputted to report an error, otherwise, the construction is successful, the prefix codes corresponding to the sorted code lengths are generated; and a sequence regulator receiving the prefix codes corresponding to the sorted code lengths, and regulating, according to the position correspondence relationship recorded by the sort indexer, a sequence of the prefix codes corresponding to the sorted code lengths to obtain the prefix codes corresponding to the code lengths.

In the above mentioned method, the code lengths are sorted in an increasing sequence.

In the above mentioned method, the first prefix code is preconfigured as 0.

In the above mentioned method, the step of judging whether the adjacently previous prefix code is identical to the current prefix code from the high bit is: judging whether all bits of the adjacently previous prefix code are not all 1, wherein if they are not all 1, then it is judged that the adjacently previous prefix code is not identical to the current prefix code from the high bit; otherwise, it is judged that the adjacently previous prefix code is identical to the current prefix code from the high bit.

In the above mentioned method, the prefix codes corresponding to the code lengths transmitted by the sequence regulator are received and outputted via an output interface.

The device for realizing prefix code construction comprises sort indexing means, generating means, and sequence regulating means, wherein:

the sort indexing means is configured to receive a group of code lengths, sort the code lengths to obtain a group of sorted code lengths, and record a position correspondence relationship between the sorted code lengths and the code lengths;

the generating means receives the sorted code lengths, orderly generates prefix codes corresponding to the sorted code lengths, wherein except that a first prefix code is preconfigured, the generating means generates a current prefix code by adding 1 to an adjacently previous prefix code and then shifting left by a certain number of bits, the certain number of the bits is the difference between the sorted code length corresponding to the current prefix code and the sorted code length corresponding to the adjacently previous prefix code; and, when the current prefix code is generated, the generating means simultaneously judges whether the adjacently previous prefix code is identical to the current prefix code from high bit, if yes, outputs error information, otherwise, generates the prefix codes corresponding to the sorted code lengths; and the sequence regulating means is configured to receive the prefix codes corresponding to the sorted code lengths, and regulate, according to the position correspondence relationship recorded by the sort indexing means, a sequence of the prefix codes corresponding to the sorted code lengths to obtain the prefix codes corresponding to the code lengths.

Compared with the prior art, the device and method for realizing prefix code construction according to the present invention adopts a sort indexer to sort the code lengths to obtain sorted code lengths; then adopts a generator to receive the sorted code lengths and orderly generate corresponding prefix codes, and at last adopts a sequence regulator to regulate the sequence to obtain the prefix codes corresponding to the code lengths. The purpose that the corresponding prefix codes can be constructed according to a group of given code lengths is achieved. Furthermore, the method can report an error in time when the prefix code(s) that meets the conditions does not exist theoretically.

The features and advantages of the present invention will become more obvious after reading the detailed description of the embodiments of the present invention with reference to the drawings.

DETAILED DESCRIPTION OF THE EMBODIMENTS

The following is a description of the device and method for realizing prefix code construction according to the embodiments of the present invention with reference to the drawings.

Figure 2:
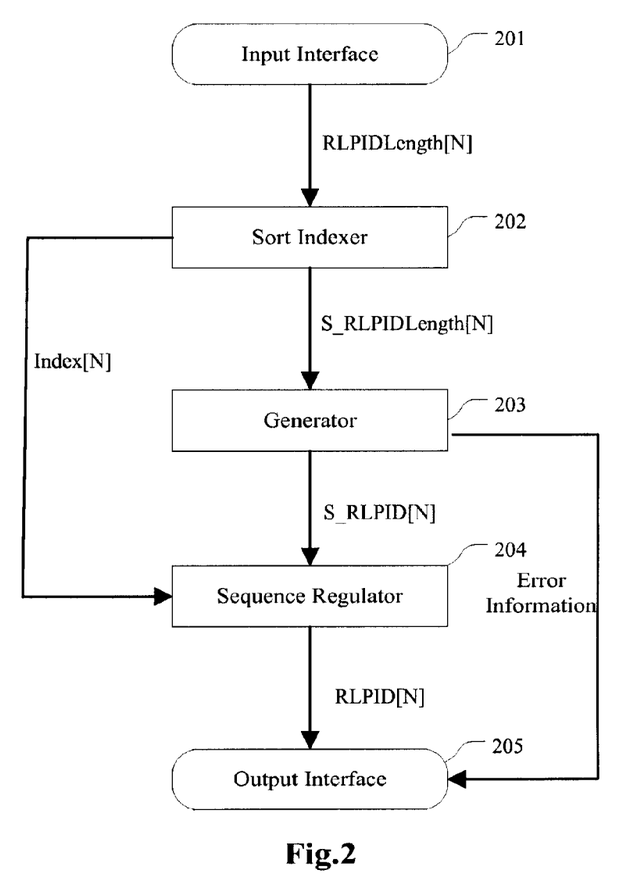
FIG. 2 is a structural schematic diagram of the device for realizing prefix code construction according to an embodiment of the present invention.

Refer to FIG. 2 for a structural schematic diagram of the device for realizing prefix code construction according to an embodiment of the present invention.

The device for realizing prefix code construction includes an input interface 201, a sort indexer 202, a generator 203, a sequence regulator 204 and an output interface 205.

The input interface 201 is used to receive a group of code lengths RLPIDLength[N] inputted by a user, and transmit the RLPIDLength[N] to the sort indexer 202. Each group of RLPIDLength[N] includes N RLPIDLengths respectively being RLPIDLength[0], RLPIDLength[1], RLPIDLength[ ] . . . RLPIDLength[i] . . . RLPIDLength[N−1]. Wherein, N and i are both integers.

The sort indexer 202 is used to receive the RLPIDLength[N] transmitted by the input interface 201, sort the code lengths in RLPIDLength[N] to obtain a group of sorted code lengths S_RLPIDLength[N], and record the position correspondence relationship Index[N] between S_RLPIDLength[N] and RLPIDLength[N]. Each group of S_RLPIDLength[N] includes N S_RLPIDLengths respectively being S_RLPIDLength[0], S_RLPIDLength[1], S_RLPIDLength[2] . . . S_RLPIDLength [i] . . . S_RLPIDLength [N−1].

The generator 203 receives S_RLPIDLength[N], orderly generates the prefix code S_RLPID[i] corresponding to each code length S_RLPIDLength[i] in S_RLPIDLength[N]. S_RLPID[i] constructs a group of prefix codes S_RLPID[N]. Except that the first prefix code S_RLPID[0] is preconfigured, the current prefix code S_RLPID[i] is generated by adding 1 to the adjacently previous prefix code S_RLPID[i−1] and shifting left by a certain number of bits; the certain number of the bits is the difference between S_RLPIDLength[i] corresponding to S_RLPID[i] and S_RLPIDLength[i−1] corresponding to S_RLPID[i−1]. In addition, when S_RLPID[i] is generated, the generator simultaneously judges whether S_RLPID[i−1] is identical to S_RLPID[i] from high bit; if yes, the construction fails, and error information is outputted to the output interface 205, otherwise the construction is successful, S_RLPID[N] are generated, and transmitted to the sequence regulator 204.

The sequence regulator 204 is used to receive S_RLPID[N], regulate the sequence of S_RLPID[N] according to the position correspondence relationship Index[N] between S_RLPIDLength[N] and RLPIDLength[N] recorded by the sort indexer 202, and obtain the prefix code RLPID[N] corresponding to RLPIDLength[N].

The output interface 205 is used to receive and output the error information transmitted by the generator 203 or the RLPID[N] transmitted by the sequence regulator 204.

Figure 3:
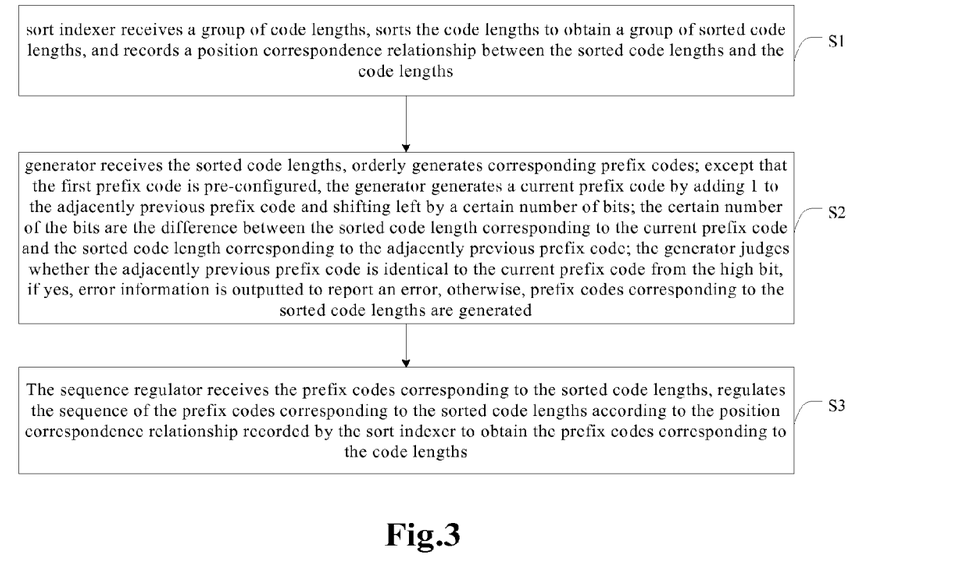
FIG. 3 is a flowchart of the method for realizing prefix code construction according to an embodiment of the present invention.

Refer to FIG. 3 for a flowchart of the method for realizing prefix code construction according to an embodiment of the present invention.

The method for realizing prefix code construction includes the following steps:

step S1, a sort indexer 202 receives a group of code lengths RLPIDLength[N], sorts the code lengths RLPIDLength[N] to obtain a group of sorted code lengths S_RLPIDLength[N], and records the position correspondence relationship Index[N] between the sorted code lengths S_RLPIDLength[N] and the code lengths RLPIDLength[N];

step S2, a generator 203 receives the sorted code lengths S_RLPIDLength[N], orderly generates corresponding prefix code S_RLPID[i] respectively; except that the first prefix code S_RLPID[0] is preconfigured, the current prefix code S_RLPID[i] is generated by adding 1 to the adjacently previous prefix code S_RLPID[i−1] and shifting left by a certain number of bits, the certain number of the bits is the difference between the sorted code length S_RLPIDLength[i] corresponding to the current prefix code S_RLPID[i] and the sorted code length S_RLPIDLength[i−1] corresponding to the adjacently previous prefix code S_RLPID[i−1]; the generator judges whether the adjacently previous prefix code S_RLPID[i−1] is identical to the current prefix code S_RLPID[i] from the high bit; if yes, error information is outputted to report an error, otherwise the prefix codes S_RLPID[N] corresponding to the sorted code lengths S_RLPIDLength[N] is generated; and step S3, a sequence regulator 204 receives the prefix codes S_RLPID[N] corresponding to the sorted code lengths S_RLPIDLength[N], regulates the sequence of the prefix codes S_RLPID[N] corresponding to the sorted code lengths S_RLPIDLength[N] according to the position correspondence relationship Index[N]recorded by the sort indexer 202, and obtains the prefix codes RLPID[N] corresponding to the code lengths RLPIDLength[N].

Figure 4:
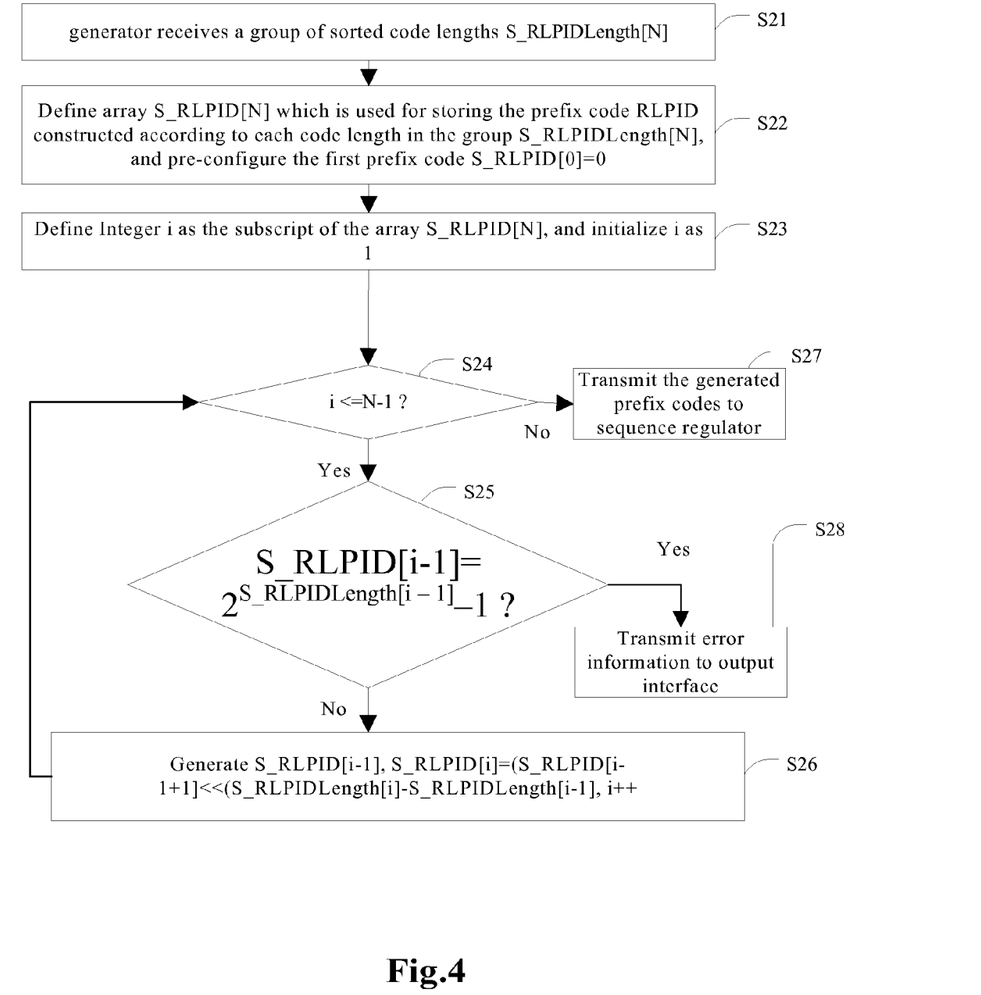
FIG. 4 is a detailed schematic diagram of Step S2 in FIG. 3.

Refer to FIG. 4 for a detailed schematic diagram of Step S2 in FIG. 3. In the above mentioned step S2, it further includes the following steps:

S21, the generator 203 receives a group of sorted code lengths S_RLPIDLength[N];

S22, an array S_RLPID[N] is defined to be used for storing the prefix code RLPID constructed according to each code length in the group S_RLPIDLength[N], and the first prefix code S_RLPID[0]=0 is pre-configured as 0;

S23, an integer i is defined as the subscript of the array S_RLPID[N], and is initialized as 1;

S24, it is judged whether i is not greater than N−1, if yes, step S25 is executed, otherwise step S27 is executed;

S25, it is judged whether the adjacently previous prefix code is identical to the current prefix code from the high bit, i.e. judging whether S_RLPID[i−1] is equal to $2^{S\_RLPiDLength[i-1]}-1$, namely, judging whether all the bits of S_RLPID[i−1] are 1, if yes, execute step S28, otherwise step S26 is executed;

S26, S_RLPID[i−1] is generated, S_RLPID[i]=(S_RLPID[i−1]+1)<<(S_RLPIDLength[i]−S_RLPIDLength[i−1]), then add 1 to i and execute step S24;

S27, the generated prefix codes are transmitted to the sequence regulator 204; and S28, error information is transmitted to the output interface 205.

Figure 5:
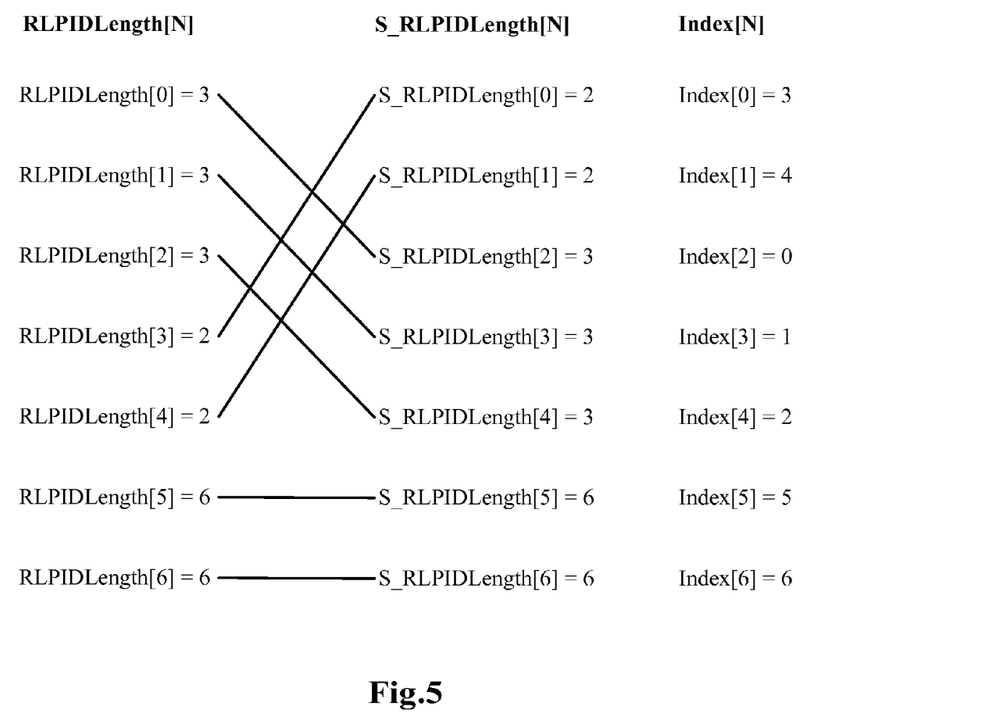
FIG. 5 to FIG. 6 are schematic diagrams of a detailed embodiment of the method for realizing prefix code construction according to the present invention.
Figure 6:
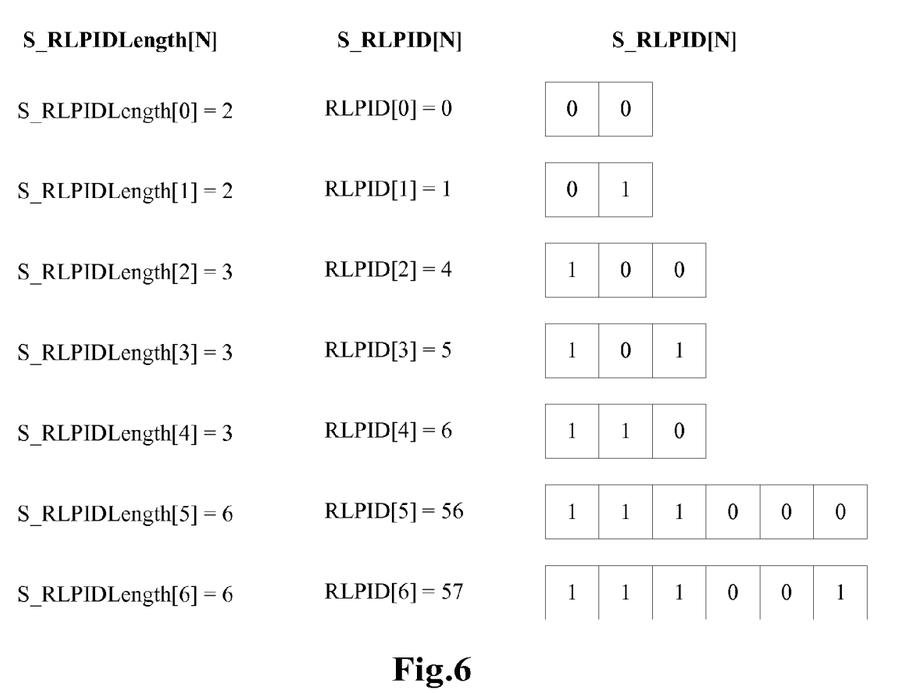

Refer to FIG. 5 to FIG. 6 for schematic diagrams of an embodiment of the method for realizing prefix code construction according to the present invention.

The code lengths of 7 RLP streams are respectively 3, 3, 3, 2, 2, 6, 6; i.e. RLPIDLength[N]={3, 3, 3, 2, 2, 6, 6}.

RLPIDLength[N] are transmitted to the device for realizing prefix code construction by the input interface 201. The sort indexer 202 sorts RLPIDLength[N] in the increasing sequence to obtain that S_RLPIDLength[N]={2, 2, 3, 3, 3, 6, 6}, and records the position correspondence relationship Index[N]={3, 4, 0, 1, 2, 5, 6} between them. For example, Index[ ]=1 indicates that RLPIDLength[1] corresponds with S_RLPIDLength[3].

The generator 203 receives S_RLPIDLength[N], and constructs S_RLPID[N].

(1) S_RLPID[0] is pre-configured as 0.

(2) It is judged that not all the bits of S_RLPID[0] are 1, and therefore S_RLPID[1]=(S_RLPID[0]+1)<<(S_RLPIDLength[1])−S_RLPIDLength[0])=1.

(3) It is judged that not all the bits of S_RLPID[1] are 1, and therefore S_RLPID[2]=(S_RLPID[1]+1)<<(S_RLPIDLength[2]−S_RLPIDLength[1])=4.

(4) It is judged that not all the bits of S_RLPID[2] are 1, and therefore S_RLPID[3]=(S_RLPID[2]+1)<<(S_RLPIDLength[3]−S_RLPIDLength[2])=5.

(5) It is judged that not all the bits of S_RLPID[3] are 1, and therefore S_RLPID[4]=(S_RLPID[3]+1)<<(S_RLPIDLength[4]−S_RLPIDLength[3])=6.

(6) It is judged that not all the bits of S_RLPID[4] are 1, and therefore S_RLPID[5]=(S_RLPID[4]+1)<<(S_RLPIDLength[5]−S_RLPIDLength[4])=56;

(7) It is judged that not all the bits of S_RLPID[5] are 1, and therefore S_RLPID[6]=(S_RLPID[5]+1)<<(S_RLPIDLength[6]−S_RLPIDLength[5])=57.

Consequently, it is constructed and obtained that S_RLPID[N]={0, 1, 4, 5, 6, 56, 57}.

The sequence regulator 204 obtains that RLPID[N]={4, 5, 6, 0, 1, 56, 57} according to S_RLPID[N] and Index[N]. For example, Index[ ]=1 indicates that S_RLPID[3] corresponds with RLPID[1], while S_RLPID[3]=5, so RLPID[1]=5.

Finally, the output interface 205 outputs RLPID[N].

Figure 7:
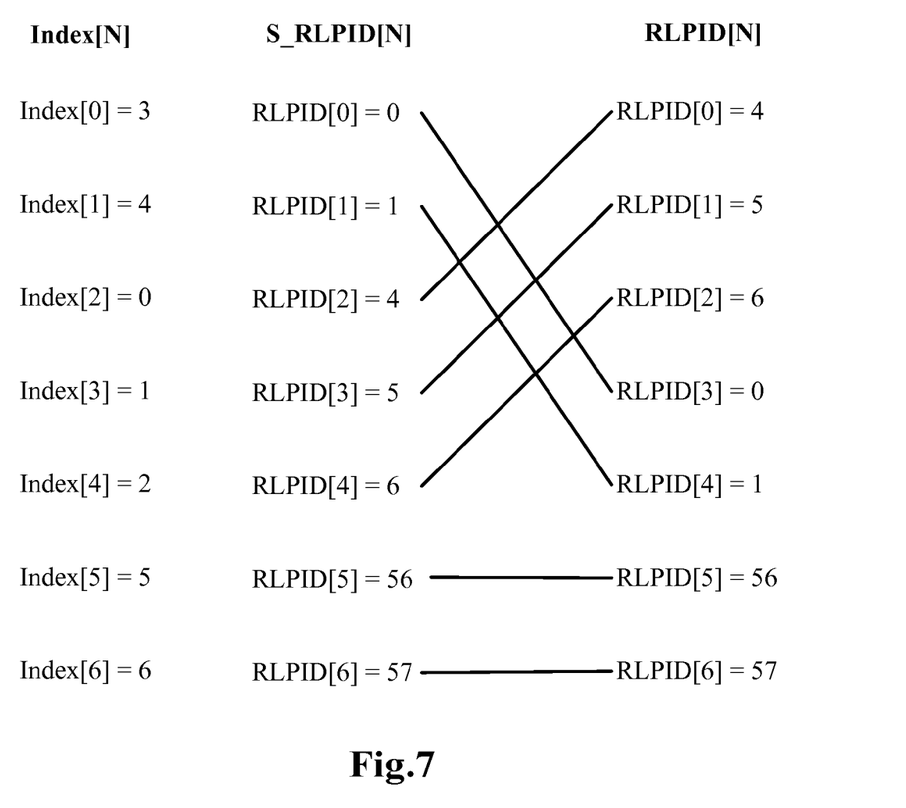
FIG. 7 to FIG. 8 are schematic diagrams of another detailed embodiment of the method for realizing prefix code construction according to the present invention.
Figure 8:
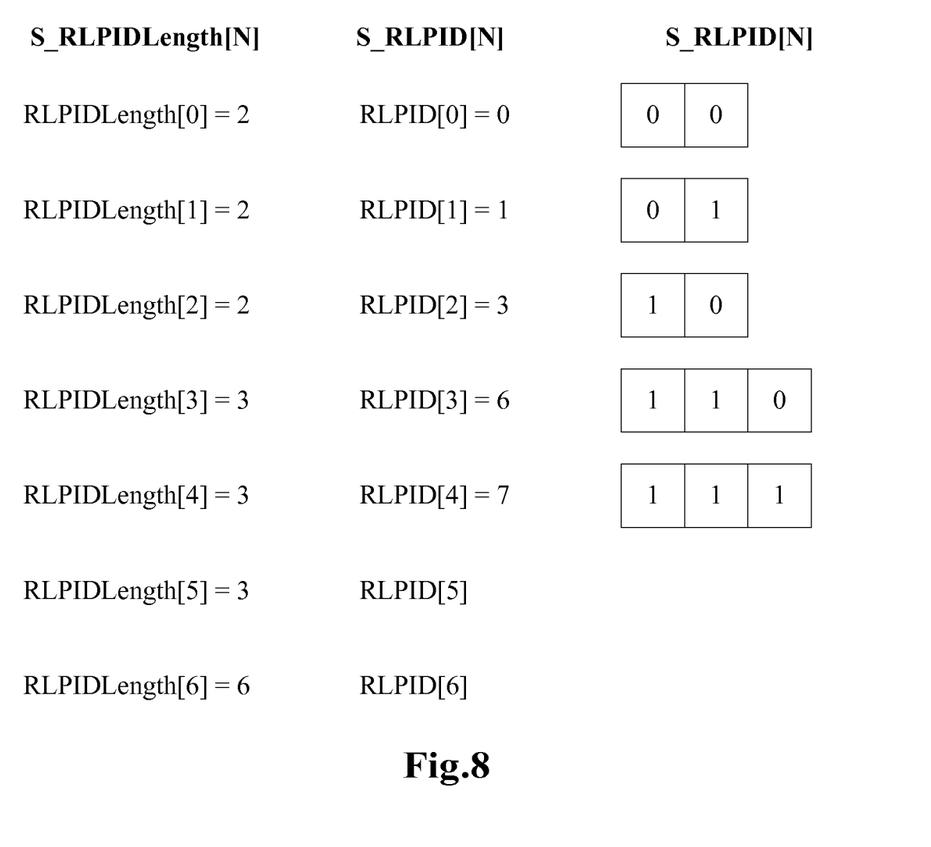

Refer to FIG. 7 to FIG. 8 for schematic diagrams of another embodiment of the method for realizing prefix code construction according to the present invention.

The code lengths of 7 RLP streams are respectively 2, 6, 3, 2, 3, 3, 2, i.e. RLPIDLength[N]={2, 6, 3, 2, 3, 3, 2}.

RLPIDLength[N] are transmitted to the device for realizing prefix code construction by the input interface 201. The sort indexer 202 sorts RLPIDLength[N] in the increasing sequence to obtain that S_RLPIDLength[N]={2, 2, 2, 3, 3, 3, 6}, and records the position correspondence relationship Index[N] between them.

The generator 203 receives S_RLPIDLength[N], and constructs S_RLPID[N].

(1) It assigns 0 to S_RLPID[0].

(2) It is judged that not all the bits of S_RLPID[0] are 1, and therefore S_RLPID[1]=(S_RLPID[0]+1)<<(S_RLPIDLength[1]−S_RLPIDLength[0])=1.

(3) It is judged that not all the bits of S_RLPID[1] are 1, and therefore S_RLPID[2]=(S_RLPID[1]+1)<<(S_RLPIDLength[2]−S_RLPIDLength[1])=3.

(4) It is judged that not all the bits of S_RLPID[2] are 1, and therefore S_RLPID[3]=(S_RLPID[2]+1)<<(S_RLPIDLength[3]−S_RLPIDLength[2])=6.

(5) It is judged that not all the bits of S_RLPID[3] are 1, and therefore S_RLPID[4]=(S_RLPID[3]+1)<<(S_RLPIDLength[4]−S_RLPIDLength[3])=7.

(6) It is judged that all the bits of S_RLPID[4] are 1, then the construction fails.

Finally, the error information is transmitted to the output interface 205, and the output interface 205 outputs the error information.

Compared with the prior art, the device and method for realizing prefix code construction according to the present invention adopts a sort indexer to sort the code lengths to obtain sorted code lengths; then adopts a generator to receive the sorted code lengths and orderly generate corresponding prefix codes, and at last adopts a sequence regulator to regulate the sequence to obtain the prefix codes corresponding to the code lengths. The purpose that the corresponding prefix codes can be constructed according to a group of given code lengths is achieved. Furthermore, the method can report an error in time when the prefix code(s) that meets the conditions does not exist theoretically.

The above are just preferred embodiments of the present invention, and shall not limit the present invention. As for those skilled in the art, the present invention may have various modifications and alternations. All the modifications, equivalent substitutions, and improvements etc made within the spirit and principles of the present invention shall be included in the protection scope of the present invention.

What is claimed is:

1. A device for realizing prefix code construction, comprising a sort indexer, a generator, and a sequence regulator, wherein:

the sort indexer is configured to receive a group of code lengths, sort the code lengths to obtain a group of sorted code lengths, and record a position correspondence relationship between the sorted code lengths and the code lengths;

the generator receives the sorted code lengths, orderly generates prefix codes corresponding to the sorted code lengths, wherein except that a first prefix code is preconfigured, the generator determines a difference between the sorted code length corresponding to the current prefix code and the sorted code length corresponding to the adjacently previous prefix code, the generator generates a current prefix code at least by adding 1 to an adjacently previous prefix code and for a non-zero determined difference then shifting left by the determined difference; and, when the current prefix code is generated, the generator simultaneously judges whether the adjacently previous prefix code is identical to the current prefix code from high bit, if yes, outputs error information, otherwise, generates the prefix codes corresponding to the sorted code lengths; and the sequence regulator is configured to receive the prefix codes corresponding to the sorted code lengths, and regulate, according to the position correspondence relationship recorded by the sort indexer, a sequence of the prefix codes corresponding to the sorted code lengths to obtain the prefix codes corresponding to the code lengths.

2. The method for realizing prefix code construction according to claim 1, wherein the code lengths are sorted in an increasing sequence.

3. The device for realizing prefix code construction according to claim 1, wherein the first prefix code is preconfigured as 0.

4. The device for realizing prefix code construction according to claim 1, further comprising: an input interface, configured to receive the code lengths inputted by a user, and transmit the code lengths to the sort indexer.

5. The device for realizing prefix code construction according to claim 1, further comprising: an output interface, configured to receive and output the error information transmitted by the generator or the prefix codes corresponding to the code lengths transmitted by the sequence regulator.

6. A method for realizing prefix code construction, comprising steps of:

receiving a group of code lengths by a sort indexer, sorting the code lengths to obtain a group of sorted code lengths, and recording a position correspondence relationship between the sorted code lengths and the code lengths;

receiving the sorted code lengths by a generator, orderly generating corresponding prefix codes, wherein except that a first prefix code is preconfigured, a difference is determined between the sorted code length corresponding to the current prefix and the sorted code length corresponding to the adjacently previous prefix code; a current prefix code is obtained at least by adding 1 to an adjacently previous prefix code and for a non-zero determined difference then shifting left by the determined difference; the generator judges whether the adjacently previous prefix code is identical to the current prefix code from high bit, if yes, the construction fails, and error information is outputted to report an error, otherwise, the construction is successful, the prefix codes corresponding to the sorted code lengths are generated; and receiving, by a sequence regulator, the prefix codes corresponding to the sorted code lengths, and regulating, according to the position correspondence relationship recorded by the sort indexer, a sequence of the prefix codes corresponding to the sorted code lengths to obtain the prefix codes corresponding to the code lengths.

7. The method for realizing prefix code construction according to claim 6, wherein the code lengths are sorted in an increasing sequence.

8. The method for realizing prefix code construction according to claim 6, wherein the first prefix code is preconfigured as 0.

9. The method for realizing prefix code construction according to claim 6, wherein the step of judging whether the adjacently previous prefix code is identical to the current prefix code from the high bit is: judging whether all bits of the adjacently previous prefix code are not all 1, wherein if they are not all 1, then it is judged that the adjacently previous prefix code is not identical to the current prefix code from the high bit; otherwise, it is judged that the adjacently previous prefix code is identical to the current prefix code from the high bit.

10. The method for realizing prefix code construction according to claim 6, wherein the prefix codes corresponding to the code lengths transmitted by the sequence regulator are received and outputted via an output interface.

11. A device for realizing prefix code construction, comprising sort indexing means, generating means, and sequence regulating means, wherein:

the sort indexing means is configured to receive a group of code lengths, sort the code lengths to obtain a group of sorted code lengths, and record a position correspondence relationship between the sorted code lengths and the code lengths;

the generating means receives the sorted code lengths, orderly generates prefix codes corresponding to the sorted code lengths, wherein except that a first prefix code is preconfigured, the generator determines a difference between the sorted code length corresponding to the current prefix code and the sorted code length corresponding to the adjacently previous prefix code, the generating means generates a current prefix code at least by adding 1 to an adjacently previous prefix code and for a non-zero determined difference then shifting left by the determined difference; and, when the current prefix code is generated, the generating means simultaneously judges whether the adjacently previous prefix code is identical to the current prefix code from high bit, if yes, outputs error information, otherwise, generates the prefix codes corresponding to the sorted code lengths; and
the sequence regulating means is configured to receive the prefix codes corresponding to the sorted code lengths, and regulate, according to the position correspondence relationship recorded by the sort indexing means, a sequence of the prefix codes corresponding to the sorted code lengths to obtain the prefix codes corresponding to the code lengths.

* * * * *